US009804201B2

(12) United States Patent
Young et al.

(10) Patent No.: US 9,804,201 B2
(45) Date of Patent: Oct. 31, 2017

(54) CURRENT MONITORING DEVICE

(75) Inventors: Jeffrey Stephen Young, Tewksbury, MA (US); Vishwas Mohaniraj Deokar, Acton, MA (US); Arthur Joseph Blake, Jr., Leominster, MA (US)

(73) Assignee: SCHNEIDER ELECTRIC IT CORPORATION, West Kingston, RI (US)

( * ) Notice: Subject to any disclaimer, the term of this patent is extended or adjusted under 35 U.S.C. 154(b) by 68 days.

(21) Appl. No.: 14/395,957

(22) PCT Filed: Apr. 25, 2012

(86) PCT No.: PCT/US2012/034914
§ 371 (c)(1),
(2), (4) Date: Oct. 21, 2014

(87) PCT Pub. No.: WO2013/162536
PCT Pub. Date: Oct. 31, 2013

(65) Prior Publication Data
US 2015/0102803 A1    Apr. 16, 2015

(51) Int. Cl.
*G01R 15/18* (2006.01)
*G01R 21/00* (2006.01)
(Continued)

(52) U.S. Cl.
CPC .......... *G01R 15/18* (2013.01); *G01R 1/22* (2013.01); *G01R 15/186* (2013.01); *G01R 21/00* (2013.01); *H01R 4/2433* (2013.01); *H01R 12/675* (2013.01)

(58) Field of Classification Search
None
See application file for complete search history.

(56) References Cited

U.S. PATENT DOCUMENTS 4,158,808 A  6/1979  Massa et al.
4,258,348 A  3/1981  Belfer et al.
(Continued)

FOREIGN PATENT DOCUMENTS

CN  1495432 A  5/2004
CN  1717844 A  1/2006
(Continued)

OTHER PUBLICATIONS

English Translation of WO 2005029671.*
(Continued)

*Primary Examiner* — Jermele M Hollington
*Assistant Examiner* — Douglas X Rodriguez
(74) *Attorney, Agent, or Firm* — Lando & Anastasi, LLP

(57) ABSTRACT

According to one aspect, embodiments of the invention provide a current monitoring device comprising a current transformer configured to be removeably coupled to a power line and to generate a reference signal having a level related to a current level of the power line, a sensor circuit connected to the current transformer and configured to convert the reference signal to a measurement signal, a flexible cable having a first end and a second end, the first end coupled to the sensor circuit, and a connection portion coupled to the second end of the flexible cable and configured to be removeably coupled to a communications bus, wherein the sensor circuit is further configured to provide the measurement signal to the communication bus via the flexible cable and the connection portion.

19 Claims, 5 Drawing Sheets

(51) Int. Cl.
*G01R 1/22* (2006.01)
*H01R 4/24* (2006.01)
*H01R 12/67* (2011.01)

(56) References Cited

U.S. PATENT DOCUMENTS

| | | |
|---|---|---|
| 5,179,376 A | 1/1993 | Pomatto |
| 5,416,808 A | 5/1995 | Witsaman et al. |
| 5,420,523 A | 5/1995 | Walker et al. |
| 5,800,187 A | 9/1998 | Vermon et al. |
| 5,831,428 A | 11/1998 | Pyle et al. |
| 5,855,491 A | 1/1999 | Hintner et al. |
| 5,896,027 A | 4/1999 | So et al. |
| 5,914,666 A | 6/1999 | Zingsheim et al. |
| 5,959,818 A | 9/1999 | Blakely |
| 5,995,911 A | 11/1999 | Hart |
| 6,064,192 A | 5/2000 | Redmyer |
| 6,091,237 A | 7/2000 | Chen |
| 6,243,626 B1 | 6/2001 | Schanin |
| 6,291,986 B1 | 9/2001 | Sorensen |
| 6,292,108 B1 | 9/2001 | Straser et al. |
| 6,292,717 B1 | 9/2001 | Alexander et al. |
| 6,313,641 B1 | 11/2001 | Brooks |
| 6,330,516 B1 | 12/2001 | Kammeter |
| 6,373,238 B2 | 4/2002 | Lewis et al. |
| 6,452,767 B1 | 9/2002 | Brooks |
| 6,634,240 B1 | 10/2003 | Wallen |
| 6,788,508 B2 | 9/2004 | Papallo, Jr. et al. |
| 6,792,337 B2 | 9/2004 | Blackett et al. |
| 6,865,073 B2 | 3/2005 | Werner et al. |
| 7,068,184 B2 | 6/2006 | Yee et al. |
| 7,174,258 B2 | 2/2007 | Hart |
| 7,218,122 B1 | 5/2007 | Nastasi et al. |
| 7,253,640 B2 | 8/2007 | Engel et al. |
| 7,265,533 B2 | 9/2007 | Lightbody et al. |
| 7,412,338 B2 | 8/2008 | Wynans et al. |
| 7,453,267 B2 | 11/2008 | Westbrock, Jr. et al. |
| 7,478,003 B2 | 1/2009 | Cowan et al. |
| 8,004,226 B2 | 8/2011 | Hartman et al. |
| 8,321,163 B2 | 11/2012 | Ewing et al. |
| 8,624,578 B2 | 1/2014 | Rupert et al. |
| 8,700,747 B2 | 4/2014 | Spitaels et al. |
| 8,787,372 B2 | 7/2014 | Cohen et al. |
| 8,958,923 B2 | 2/2015 | Kake et al. |
| 9,267,826 B2 | 2/2016 | Paik et al. |
| 9,341,686 B2 | 5/2016 | Deak et al. |
| 2003/0222603 A1 | 12/2003 | Mogilner et al. |
| 2004/0075343 A1 | 4/2004 | Wareham et al. |
| 2004/0128087 A1 | 7/2004 | Viaro et al. |
| 2004/0136124 A1 | 7/2004 | Engel et al. |
| 2004/0183522 A1 | 9/2004 | Gunn et al. |
| 2005/0210337 A1 | 9/2005 | Chester et al. |
| 2006/0238932 A1 | 10/2006 | Westbrock et al. |
| 2007/0069715 A1 | 3/2007 | Bruno |
| 2007/0136010 A1 | 6/2007 | Gunn et al. |
| 2008/0007416 A1 | 1/2008 | Cern |
| 2008/0094162 A1 | 4/2008 | Schaerrer et al. |
| 2008/0126665 A1 | 5/2008 | Burr et al. |
| 2008/0180275 A1 | 7/2008 | Whitaker et al. |
| 2008/0238573 A1 | 10/2008 | Yamazaki |
| 2009/0066317 A1 | 3/2009 | de Buda |
| 2009/0115403 A1 | 5/2009 | Bernklau |
| 2009/0292403 A1 | 11/2009 | Howell et al. |
| 2010/0033122 A1 | 2/2010 | Hartman et al. |
| 2010/0060469 A1 | 3/2010 | Hetzmannseder et al. |
| 2010/0085036 A1 | 4/2010 | Banting et al. |
| 2010/0207604 A1 | 8/2010 | Bitsch et al. |
| 2010/0235122 A1 | 9/2010 | McCrea et al. |
| 2010/0237853 A1 | 9/2010 | Bose et al. |
| 2010/0264906 A1 | 10/2010 | Shamir et al. |
| 2010/0280774 A1 | 11/2010 | Ewing et al. |
| 2010/0299401 A1 | 11/2010 | Lloyd |
| 2010/0301837 A1 | 12/2010 | Higuma et al. |
| 2010/0308792 A1 | 12/2010 | Rupert et al. |
| 2010/0328849 A1 | 12/2010 | Ewing et al. |
| 2011/0046792 A1 | 2/2011 | Imes et al. |
| 2011/0098952 A1 | 4/2011 | Long et al. |
| 2011/0148393 A1 | 6/2011 | de Buda |
| 2011/0260710 A1 | 10/2011 | Zhu et al. |
| 2011/0285362 A1 | 11/2011 | Huomo |
| 2012/0062249 A1 | 3/2012 | Shamir |
| 2012/0085627 A1 | 4/2012 | Yang |
| 2012/0130656 A1 | 5/2012 | Bickel |
| 2012/0191878 A1 | 7/2012 | Yoshida |
| 2012/0200285 A1 | 8/2012 | Carpenter et al. |
| 2012/0203481 A1 | 8/2012 | Carpenter et al. |
| 2012/0271570 A1 | 10/2012 | Paik et al. |
| 2012/0271579 A1 | 10/2012 | Deokar et al. |
| 2013/0014894 A1 | 1/2013 | Lai et al. |
| 2013/0017315 A1 | 1/2013 | Lai et al. |
| 2013/0018609 A1 | 1/2013 | Filippenko et al. |
| 2013/0090869 A1 | 4/2013 | Ewing et al. |
| 2013/0165107 A1 | 6/2013 | Richardson |
| 2014/0062471 A1 | 3/2014 | Deak et al. |
| 2015/0331024 A1 | 11/2015 | Bruel et al. |

FOREIGN PATENT DOCUMENTS

| | | |
|---|---|---|
| CN | 201035075 Y | 3/2008 |
| CN | 101277130 A | 10/2008 |
| CN | 201667273 U | 12/2010 |
| CN | 102122810 A | 7/2011 |
| CN | 102299559 A | 12/2011 |
| CN | 102393485 A | 3/2012 |
| DE | 29512624 U1 | 11/1995 |
| DE | 10201495 A1 | 8/2003 |
| DE | 102009003654 B3 | 10/2010 |
| EP | 1102073 A1 | 5/2001 |
| EP | 1 703 289 A1 | 9/2006 |
| EP | 1983616 A2 | 10/2008 |
| EP | 2 354 799 A1 | 8/2011 |
| GB | 2 241 396 A | 8/1991 |
| WO | 2005029671 A1 | 3/2005 |
| WO | 2006021030 A1 | 3/2006 |
| WO | 2011/150173 A1 | 12/2011 |

OTHER PUBLICATIONS

English Translation of DE 10201495.*
Extended European Search Report from corresponding European Application No. 12875243.3 dated Nov. 10, 2015.
Power Systems Design, Smart Grid Integrity, 2010, http://www.powersystemsdesign.com/smart-grid-integrity.
"Emonitor Installation Guide", 2010 PowerHouse Dynamics, Inc., pp. 1-39.
"Emonitor User Manual", 2010 PowerHouse Dynamics, Inc., pp. 1-50.
"Panelboard Monitoring System", www.veris.com, 2008 Veris Industries, pp. 136-137.
"TED 5000 Footprints User Manual", www.theenergydetective.com, pp. 1-37.
Chung-Ping Young et al., "Digital Power Metering Manifold", IEEE Transactions on Instumentation and Measurement, IEEE Service Center, Piscataway, NJ, US, vol. 47, No. 1, Feb. 1, 1998 (Feb. 1, 1998), XP011024460, pp. 224-228.
Mars, Using a supercapacitor to manage your power, Energy Harvesting Journal, Dec. 14, 2009, pp. 1-11.
Notification of Transmittal of the International Search Report and the Written Opinion of the International Searching Authority from corresponding PCT/US2012/034914 dated Aug. 1, 2012.
"Oscillator Options", Meinberg, https://meinbergglobal.com, Nov. 2015.
"PowerLogic ION7300 Series, Power & Energy Meter, Modicon Modbus Serial Communications Protocol", Schneider Electric, Dec. 2006.
"Protime 100 Sequence of Event Recorder User's Guide", Monaghan Engineering, Inc., Publication #10032, Version 1.10, Sep. 10, 2013.
"SICAM I/O Unit 7XV5673 Device Manual", Siemens, E50417-H1040-C484-A4, Nov. 2014.

(56) References Cited

OTHER PUBLICATIONS

"Time stamping and synchronisation", Current Trends, EBG—Electrical Systems & Equipment, Larsen & Toubro Limited, Powai Works, Mumbai 400 072, Jan.-Mar. 2004.
"Time Synchronization & Timekeeping", Schneider Electric, 70072-0111-14, Jun. 2009.
"Time Synchronization in Electrical Systems", Meinberg, [<https://www.meinbergglobal.com/english/info/time-synchronization-electrical-systems.htm>], Retrieved from the Internet on Jul. 1, 2016.
"Time Synchronization Using ABB Relays", ABB Application Note, Substation Automation and Protection Dvision, AN-96A-04, DPU2000R, Jul. 7, 2004.
Australian Patent Examination Report from corresponding Australian Patent Application No. 2012378295 dated May 25, 2016.
Cristian et al., "Probabilistic clock synchronization", Distributed Computing (1989) 3: pp. 146-158.

* cited by examiner

CURRENT MONITORING DEVICE

This application is a U.S. National Stage application and claims priority under 35 U.S.C. §371 from International Application No. PCT/US2012/034914, filed Apr. 25, 2012, which is hereby incorporated herein by reference in its entirety.

BACKGROUND OF INVENTION

1. Field of the Invention

At least one example in accordance with the present invention relates generally to systems and methods for monitoring a load center for current, power and energy usage.

2. Discussion of Related Art

A load center or panelboard is a component of an electrical supply system which divides an electrical power feed from a power line into different subsidiary circuit branches. Each subsidiary circuit branch may be connected to a different load. Thus, by dividing the electrical power feed into subsidiary circuit branches, the load center may allow a user to individually control and monitor the current, power and energy usage of each branch circuit and in some instances each load.

Current sensors are commonly used to monitor activity of a load center. For example, Current Transformers (CT) are commonly used to monitor current, power and/or energy consumption in a subsidiary or main branch of a load center. A CT may be used to measure current in a branch by producing a reduced current signal, proportionate to the current in the branch, which may be further manipulated and measured. For example, a CT coupled to a branch of a load center may produce a reduced current AC signal, proportionate to the magnitude of AC current in the branch. The reduced current AC signal may then either be measured directly or converted to a digital signal and then measured. Based on the signal received, the level of current in the subsidiary branch may be determined.

SUMMARY OF THE INVENTION

Aspects in accord with the present invention are directed to a current monitoring device comprising a current transformer configured to be removeably coupled to a power line and to generate a reference signal having a level related to a current level of the power line, a sensor circuit connected to the current transformer and configured to convert the reference signal to a measurement signal, a flexible cable having a first end and a second end, the first end coupled to the sensor circuit, and a connection portion coupled to the second end of the flexible cable and configured to be removeably coupled to a communications bus, wherein the sensor circuit is further configured to provide the measurement signal to the communication bus via the flexible cable and the connection portion.

According to one embodiment, the current monitoring device further comprises a first housing containing the sensor circuit and the current transformer, wherein the first housing includes a first portion containing the current transformer and a second portion containing the sensor circuit, and wherein the first portion is rotatably coupled to the second portion. In one embodiment, the first housing is configured to be rotated between a first position and a second position, wherein, in the first position, the first portion of the first housing is rotated about the second portion to allow external access to an interior chamber, and wherein, in the second position, the first portion of the first housing is rotated about the second portion so that the first portion encompasses the interior chamber.

According to another embodiment, the connection portion includes a second housing coupled to the second end of the flexible cable. In one embodiment, the second housing includes an insulation displacement connector configured to couple the connection portion to the communication bus. In another embodiment, second housing further includes a lid configured to lock the communication bus in a position adjacent to the insulation displacement connector. In one embodiment, the second housing further includes a comb configured to separate discrete conductors of the communication bus.

According to one embodiment, the measurement signal is a digital measurement signal. In another embodiment, the current transformer is a 200 A current transformer.

Another aspect in accord with the present invention is directed to a method for monitoring a power line within a load center, the method comprising coupling a current transformer to the power line within the load center, the current transformer coupled to a sensor circuit, the sensor circuit coupled to a connection portion via a flexible cable, coupling the connection portion to a communication bus within the load center, generating, with the current transformer, a reference signal having a level related to a current level of the power line, converting, with the sensor circuit, the reference signal to a measurement signal, and providing, via the connection portion, the measurement signal to the communication bus.

According to one embodiment, the current transformer is coupled to the power line at a first location within the load center and the connection portion is coupled to the communication bus at a second location within the load center. In one embodiment, the act of coupling a current transformer to the power line includes encompassing the power line within the current transformer. In another embodiment, the act of coupling the connection portion to the communication bus includes piercing an outer insulation layer of the communication bus with at least one contact of the connection portion and connecting the at least one contact to a conductor within the communication bus.

According to one embodiment, the measurement signal is a digital measurement signal. In another embodiment, the current transformer is a 200 A current transformer.

One aspect in accord with the present invention is directed to a device for monitoring current in a power line within a load center, the device comprising a current transformer configured to be coupled to the power line at a first location within the load center and to generate a reference signal having a level related to a current level of the power line, a sensor circuit configured to convert the reference signal to a measurement signal and provide data related to the measurement signal to a communication bus, and means for coupling the sensor circuit to the communication bus at a second location within the load center.

According to one embodiment, the device further comprises a housing containing the sensor circuit and the current transformer, wherein the housing includes a first portion containing the current transformer and a second portion containing the sensor circuit, and wherein the first portion is rotatably coupled to the second portion. In one embodiment, the housing is configured to be rotated between a first position and a second position, wherein, in the first position, the first portion of the housing is rotated about the second portion to allow external access to an interior chamber, and wherein, in the second position, the first portion of the housing is rotated about the second portion so that the first portion encompasses the interior chamber.

According to one embodiment, the measurement signal is a digital measurement signal. In another embodiment, the current transformer is a 200 A current transformer.

BRIEF DESCRIPTION OF DRAWINGS

The accompanying drawings are not intended to be drawn to scale. In the drawings, each identical or nearly identical component that is illustrated in various FIGs. is represented by a like numeral. For purposes of clarity, not every component may be labeled in every drawing. In the drawings.

DETAILED DESCRIPTION

Figure 1:
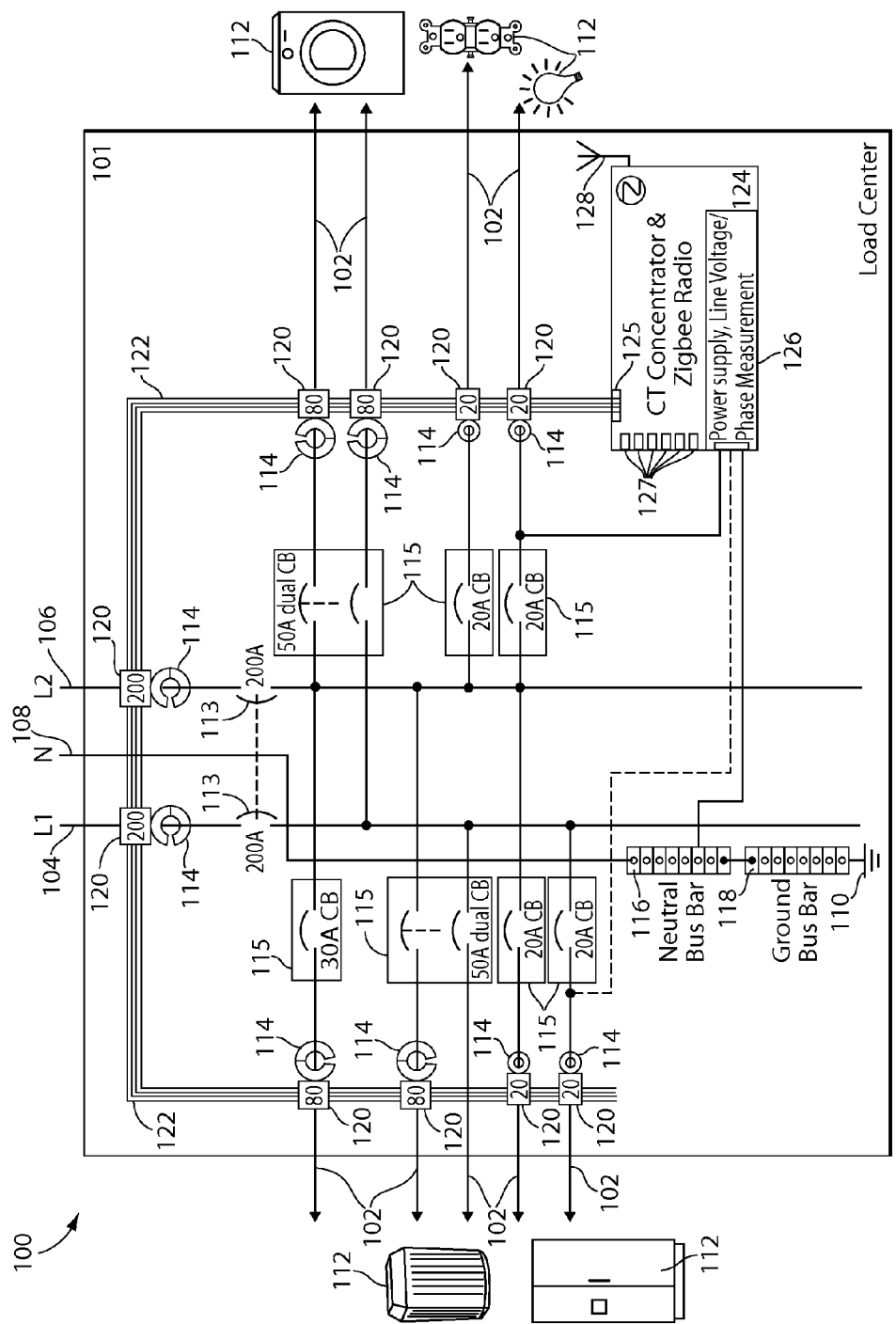
FIG. 1 is a circuit diagram of a load center in accordance with aspects of the present invention.

Embodiments of the invention are not limited to the details of construction and the arrangement of components set forth in the following description or illustrated in the drawings. Embodiments of the invention are capable of being practiced or of being carried out in various ways. Also, the phraseology and terminology used herein is for the purpose of description and should not be regarded as limiting. The use of "including," "comprising," or "having," "containing", "involving", and variations thereof herein, is meant to encompass the items listed thereafter and equivalents thereof as well as additional items.

As discussed above, CT's may be utilized with a load center of an electrical supply system to monitor circuit branches and assist in providing efficient energy management. For instance, CT's may be coupled to circuit branches inside or outside of a load center. However, multiple challenges with connecting CT's in a load center may arise as the electrical supply system grows in size and complexity.

Existing methods and systems typically rely on a system of individual CT's, each connected to a main controller and measurement unit in a "hub and spoke" topology. In such a system, each CT requires dedicated cabling connecting it to the main controller and its measurement unit, so that the number of cables or wires increases linearly with the number of sensors. In addition, some jurisdictions have regulatory requirements on the amount of "gutter space" (i.e., space within the panelboard free of wiring and other electronic devices) available within a panelboard. Therefore, as the number of CT's increases, the amount of cabling and circuitry within a panelboard may become difficult to manage and violate regulatory requirements.

In some instances it may even be difficult to physically place all of the desired CT's and corresponding circuitry within the load center, and due to the complexity of such a load center; installation, expansion and maintenance may also be expensive, difficult and even hazardous.

At least some embodiments described herein overcome these problems and provide a relatively small, less complex and more manageable method and system for utilizing CT's to monitor circuit branches of a load center.

FIG. 1 shows a load center 100 that includes a system for monitoring subsidiary circuit branches 102 of the load center 100 according to one embodiment of the current invention. The load center 100 includes a housing 101. Within the housing 101, the load center 100 includes a first input power line 104, a second input power line 106, a plurality of circuit branches 102, a neutral line 108, and a ground connection 110. The first and second input power lines 104, 106 are each configured to be coupled to an external power source (e.g., a utility power system). Each one of the plurality of circuit branches 102 is configured to be coupled between one of the input power lines 104, 106 and an external load 112 (e.g., an appliance, a power outlet, a light etc.).

According to one embodiment, each one of the input power lines 104, 106 includes a circuit breaker 113 coupled between the input power line 104, 106 and circuit branches 102. According to another embodiment, each one of the plurality of circuit branches 102 includes a circuit breaker 115 coupled between the input power line 104, 106 and an external load 112. In one embodiment, the current rating of each circuit breaker 113, 115 may be configured based on the power required by the external load 112 to which the circuit breaker's 113, 115 associated circuit branch 102 is coupled. The neutral line 108 is coupled to the ground connection 110. According to one embodiment, the neutral line is coupled to the ground connection 110 via a neutral bus bar 116. According to another embodiment, the ground connection 110 is coupled to the neutral line 108 via a ground bus bar 118.

Within the housing 101, the load center 100 also includes a plurality of Current Transformers (CT) 114, a plurality of smart sensor circuits 120, a communication bus 122, and a CT concentrator 124. According to one embodiment, the communication bus 122 includes a plurality of wires. For example, in one embodiment, the communication bus 122 is a four-conductor cable (e.g., a hi-flex unshielded 4-conductor silicone cable) including 4 wires (a power line, a return line, D+ differential pair line, D− differential pair line); however, in other embodiments, the communication bus 122 may include any number and type of wires. Each one of the plurality of CT's 114 is coupled to at least one of the plurality of circuit branches 102. According to one embodiment, CT's 114 may also be coupled to each input line 104, 106. According to one embodiment, each CT 114 encompasses a corresponding circuit branch 102 or input line 104, 106. Each one of the plurality of CT's is also coupled to a corresponding smart sensor circuit 120. Each smart sensor circuit 120 is coupled to the communication bus 122.

According to one embodiment, each smart sensor circuit 120 is coupled to the communication bus 122 so that each smart sensor circuit 120 is in electrical communication with the CT concentrator 124. The coupling of each smart sensor circuit 120 to the communication bus 122 is described in greater detail below.

According to one embodiment, the CT concentrator 124 includes a digital interface 125, at least one analog interface 127, a power module 126 and a Zigbee RF interface 128. The communication bus 122 is coupled to the digital interface 125. The power module 126 is coupled to at least one input power line 104, 106 via at least one branch circuit 102. According to one embodiment, at least one CT 114 is coupled directly to at least one analog interface 127.

According to one embodiment, AC power is provided from an external source (e.g., a utility power system) to the input lines 104, 106. AC power from the input lines 104, 106 is provided to each of the external loads 112, via the circuit branches 102. The circuit breakers 113 are configured to automatically open and prevent current in an input line 104, 106 if an overload or short circuit is detected in the input line 104, 106. The circuit breakers 115 are configured to automatically open and prevent current in a circuit branch 102 if an overload or short circuit is detected in the circuit branch 102.

The power module 126 of the CT concentrator 124 receives AC power from at least one input line 104, 106. Using the AC power, the power module 126 powers the CT concentrator 124. In addition, the CT concentrator 124 measures the AC voltage, frequency and/or phase of the AC power. According to one embodiment, the CT concentrator 124 is configured to communicate the measured AC voltage, frequency and/or phase information to the smart sensor circuits 120, via the communication bus 122. For example, in one embodiment, the CT concentrator 124 transmits phase information of the AC power to the smart sensor circuits 120 so that the CT concentrator 124 may be synchronized with the smart sensor circuits 120. According to one embodiment, the CT concentrator is also capable of being powered by a battery.

AC current passing through a circuit branch 102 or input line 104, 106 induces a proportionate AC current in its associated CT 114 which encompasses the circuit branch 102 or input line 104, 106. According to one embodiment, where a CT 114 may be coupled to multiple circuit branches 102, an AC current proportionate to the combined current in the multiple circuit branches is induced in the CT 114 which encompasses the multiple circuit branches. The smart sensor circuit 120 coupled to the CT 114 converts the proportionate AC current from the CT 114 into a digital value and then transmits the digital value, over the communications bus 122 to the CT concentrator 124. For example, according to one embodiment, a CT 114 and smart sensor circuit 120 pair produces a proportionate AC current (based on an associated circuit branch), converts the proportionate AC current into digital values, and transmits the digital values to the CT concentrator as described in U.S. patent application Ser. No. 13/089,787 entitled "SMART CURRENT TRANSFORMERS", filed on Apr. 19, 2011 (hereinafter "the '787 Application"), which is hereby incorporated herein by reference in its entirety.

According to one embodiment, the smart sensor circuit 120 may be configured to utilize the voltage, frequency and/or phase information received from the CT concentrator 124 over the communications bus 122. For example, in one embodiment, the smart sensor circuit 120 utilizes the phase information received from the CT concentrator 124 to synchronize operation with the CT concentrator 124 such that current measurements performed by the smart sensor circuits 120 can by synchronized with voltage measurements made by the CT concentrator 124. In another example, the smart sensor circuit 120 utilizes the voltage, frequency and/or phase information to calculate power and energy parameters such as RMS current, true and apparent power, and power factor of the circuit branch 102 or input line 104, 106. This information is also converted into digital values and sent to the digital interface 125 of the CT concentrator 124 over the communications bus 122. According to one embodiment, at least one CT 114 may also provide analog signals, proportionate to the AC current passing through the circuit branch 102, directly to an analog interface 127 of the CT concentrator 124.

According to one embodiment, upon receiving the current information from the smart sensor circuits 120, the CT concentrator 124 utilizes the measured voltage, frequency and/or phase information to calculate power and energy parameters such as RMS current, true and apparent power, and power factor of the circuit branch 102 or input line 104, 106.

According to another embodiment, upon receiving the current information and receiving and/or calculating the power information, the CT concentrator 124 transmits the current, power and energy information to an external client (e.g., a web server, in-home display, internet gateway etc.) via the wireless Zigbee RF interface 128 to assist in power management of the load center 100 and to assist in power management and control of a residence or other facility containing the system. The CT concentrator 124 may also transmit the current, power and energy information to an external client via a wired connection or a different type of wireless connection. For example, according to one embodiment, a CT concentrator 124 receives current information from the smart sensor circuits 120, calculates power and energy information using the received current information, and transmits the current, power, and energy information to an external client as described in the '787 Application.

As described above, each smart sensor circuit 120 is coupled to the CT concentrator 124 via the communication bus 122. According to one embodiment, each smart sensor circuit 120 is coupled to the communication bus 122 via a connection portion which is clamped onto the communication bus 122. For example, in one embodiment, electrical contacts of a connection portion, which is coupled to a smart sensor circuit 120, are pressed onto the communication bus 122 so that the electrical contacts pierce an insulation layer of the communication bus 122 and become electrically coupled to appropriate conductors within the communication bus 122. In other embodiments, the connection portion may be coupled differently to the communication bus 122. For example, according to one embodiment, the connection portion is coupled to the communication bus 122 via a bus bar or daisy chained connectors (not shown).

According to one embodiment, the connection portion is located within the same housing as the smart sensor circuit 120 and the associated CT 114. Thus the connection portion is coupled to the communication bus 122 at substantially the same location within the load center as where the CT 114 is coupled to the circuit branch 102 or input line 104. For example, in one embodiment, the connection portion and the smart sensor circuit 120 are configured as described in the '787 Application.

According to another embodiment, the connection portion is located separately from the smart sensor circuit 120 and the associated CT 114. Such a configuration may allow for increased connection flexibility within the load center as the connection portion may be coupled to the communication bus 122 at a different location then where the CT 114 is coupled to the circuit branch 102 or input line 104. This may be beneficial where the communication bus 122 and the circuit branch 102 or input line 104 desired to be monitored are not adjacent to each other. It also may be beneficial where the size of the line desired to be measured (e.g. a mains input line 104) requires a large CT 114 that is difficult (or even impossible) to connect to the input line 104 adjacent the communication bus 122.

Therefore at least some embodiments described herein provide a CT circuit (e.g. including a CT 114 and smart sensor circuit 120) which provides enhanced connection flexibility within a load center.

Figure 2:
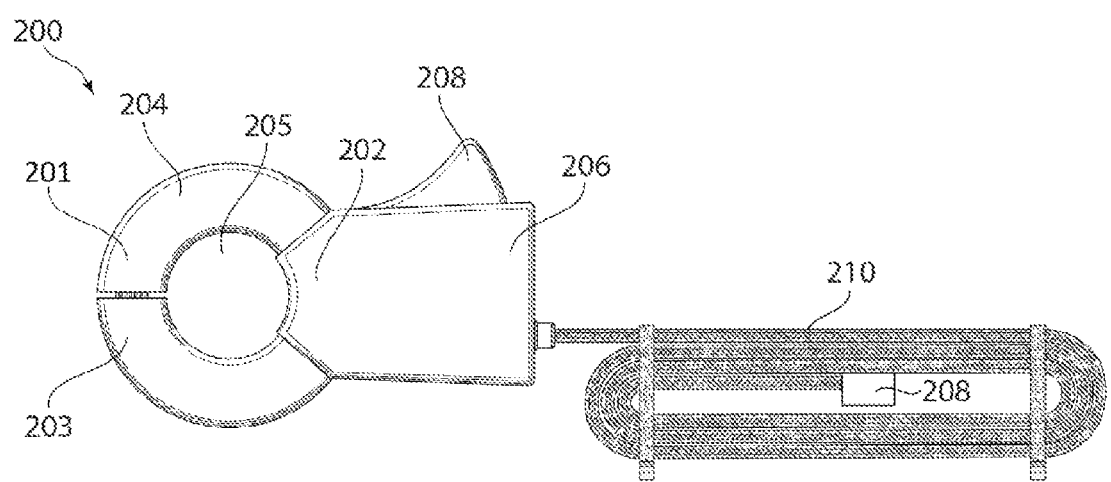
FIG. 2 is a schematic diagram of a CT circuit in accordance with aspects of the present invention.

FIG. 2 illustrates one embodiment of a CT circuit 200 in accordance with aspects of the present invention. The CT circuit 200 includes a housing 202. The housing 202 includes a first portion 204 which encompasses a CT (e.g. a CT 114) and a second portion 206 which encompasses a smart sensor circuit (e.g. a smart sensor circuit 120). The second portion 206 is coupled to a connection portion 208 via a flexible cable 210.

According to one embodiment, the first portion 204 of the housing 202 is a clamp which includes a top portion 201 and a bottom portion 203. The bottom portion 203 of the clamp is coupled to the second portion 206. The top portion 201 of the clamp is coupled to a button 208 of the second portion 206 about a lever point within the second portion 206. Absent pressure on the button 208, a spring mechanism within the second portion 206 forces the button 208 to extend outward from the second portion 206, resulting in the top portion 201 being forced against the bottom portion 203 to form an interior chamber 205.

When connection to a circuit branch 102 is desired, a user may press down on the button 208, compressing the spring mechanism, forcing the button 208 to rotate about the lever point into the second portion 206 and causing the top portion 201 to rotate about the lever point away from the bottom portion 203. As a result, the top portion 201 and bottom portion 203 move apart. As the top portion 201 and bottom portion 203 separate, an opening is formed by which a circuit branch 102 may be inserted into the interior chamber 205. Once a circuit branch 102 is inserted into the interior chamber 205, removal of pressure on the button 208 results in the spring mechanism forcing the button 208 to rotate out of the second portion 206 and the top portion 201 to rotate back towards the bottom portion 203 until the top portion 203 and bottom portion 203 are compressed together, thereby encompassing a circuit branch 102 within the interior chamber 205 of the clamp 204 (and hence the CT).

The second portion of the housing 206 encompasses a smart sensor circuit (as described above). However, the housing 202 does not include the connection portion 208 which is configured to be coupled to a communication bus 122.

Figure 3:
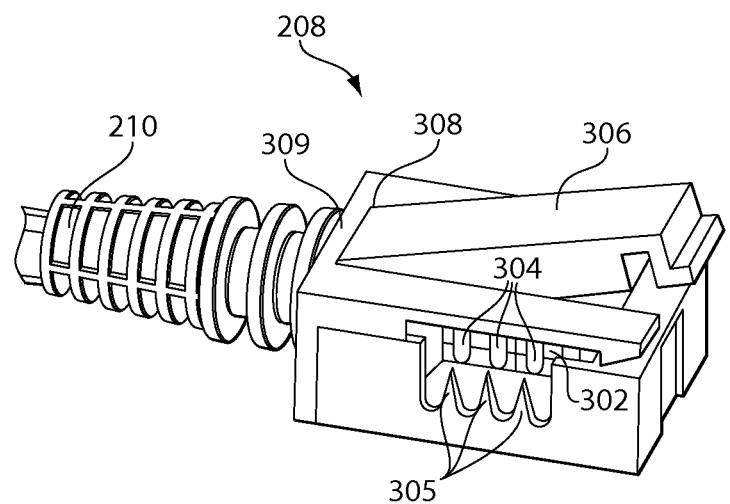
FIG. 3 is a schematic diagram of a connection portion in accordance with aspects of the present invention.

The connection portion 208 is configured to be coupled to a communication bus 122. For example, FIG. 3 illustrates a connection portion 208 in accordance with aspects of the present invention. FIG. 3 illustrates the connection portion 208 prior to being connected to a communications bus 122. According to one embodiment, the connection portion 208 includes a housing 309. The housing 309 of the connection portion 208 includes an Insulation Displacement Connector (IDC) 302 (e.g., an AVX series 9176 IDC). According to one embodiment, the IDC 302 may include a plurality of blades 304. For example, if, as discussed above, the connection portion 208 (and hence the smart sensor circuit 120 via the cable 210) is configured to be coupled to a four-conductor cable, the IDC 302 will include four blades, each blade configured to be coupled to a corresponding conductor within the cable. However, according to other embodiments, the IDC 302 may include any number of blades to adequately connect the connection portion 208 to the communications bus 122. According to one embodiment, the housing 309 of the connection portion 208 also includes comb features 305 which are configured to separate the discrete conductors within the communication bus 122.

According to one embodiment, the connection portion 208 may also include a locking lid 306 coupled to the housing 309 via a hinge 308. Prior to being coupled to the communications bus 122, the locking lid 306 of the connection portion 208 is swung away from the IDC 302, allowing a user to place the communication bus 122 adjacent to the IDC 302. The user presses down on the communication bus 122, causing the communication bus 122 to press against the IDC 302. The comb features 305 separate the discrete conductors and the plurality of blades 304 of the IDS 302 pierce the outer insulation layer of the communication bus 122, each one of the plurality of blades 304 connecting with a corresponding conductor within the communication bus 122. The user may then swing the locking lid 306 towards the IDC 302 and press down on the locking lid to lock the communication bus 122 into place.

According to other embodiments, the connection portion 208 (and hence the smart sensor circuits 120 via the cable 210) may be coupled to the communication bus 122 in a different manner. For example, connection portions of smart sensor circuits may also be coupled to the communication bus 122 via a bus bar. Upon the connection portion 208 being coupled to the communication bus 122, the corresponding smart sensor circuit 120 (and associated CT 114) is in electrical communication with the CT concentrator 124 via the cable 210, the connection portion 208 and the communication bus 122.

According to one embodiment, the connection portion 208 and the flexible cable 210 also include appropriate internal connections which are configured to couple the appropriate connections within the smart sensor circuit 120 to the communication bus 122.

By coupling the smart sensor circuit 120 (and CT 114) to the communications bus 122 via a connection portion 208 and a flexible cable 210, the connection portion 208 is able to be connected to the communication bus 122 at a different location within a load center then where the CT 114 is coupled to a circuit branch 102 or input line 104, thereby providing enhanced connection flexibility within the load center.

Figure 4:
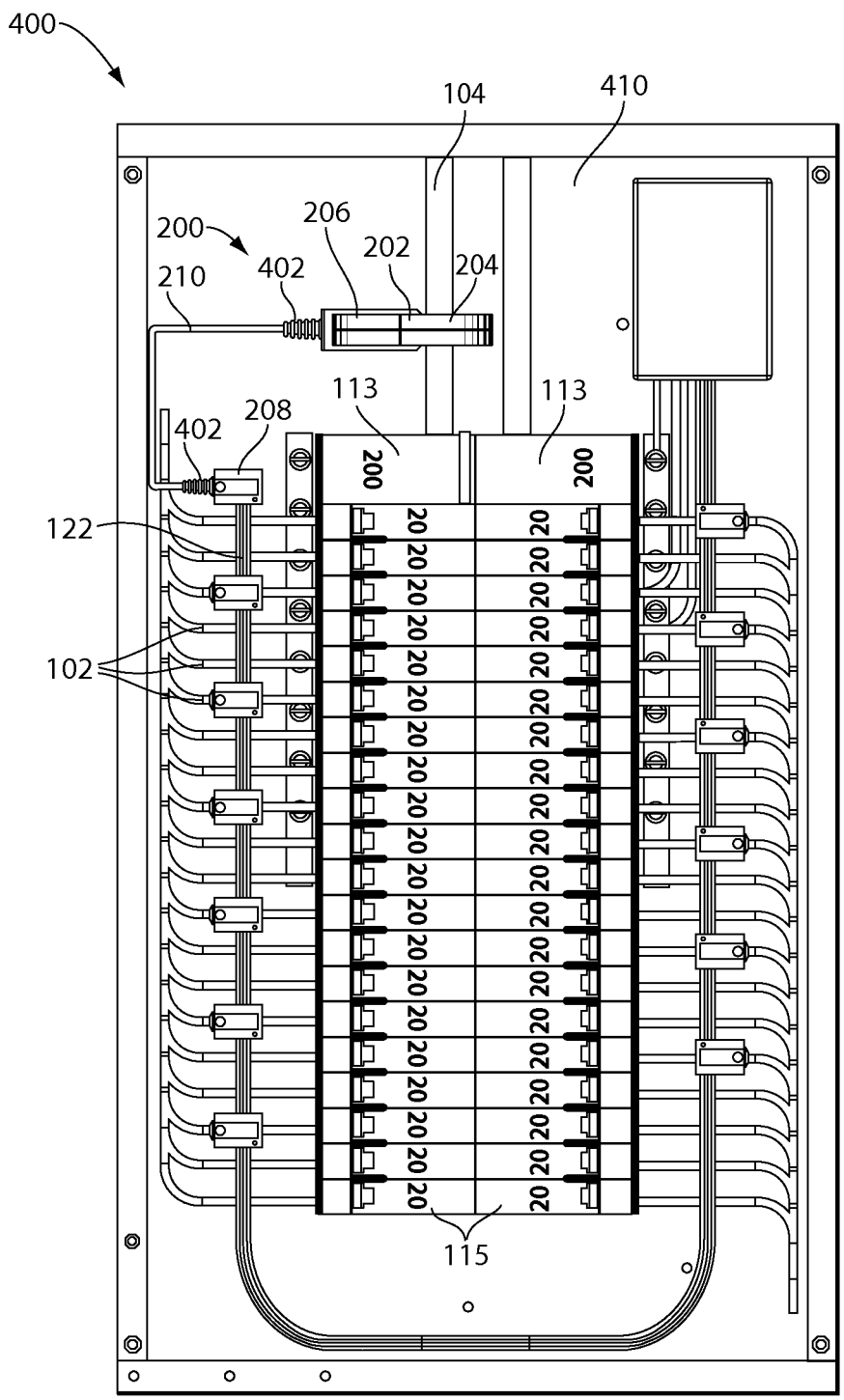
FIG. 4 is a schematic diagram of a CT circuit within a load center in accordance with aspects of the present invention.
Figure 5:
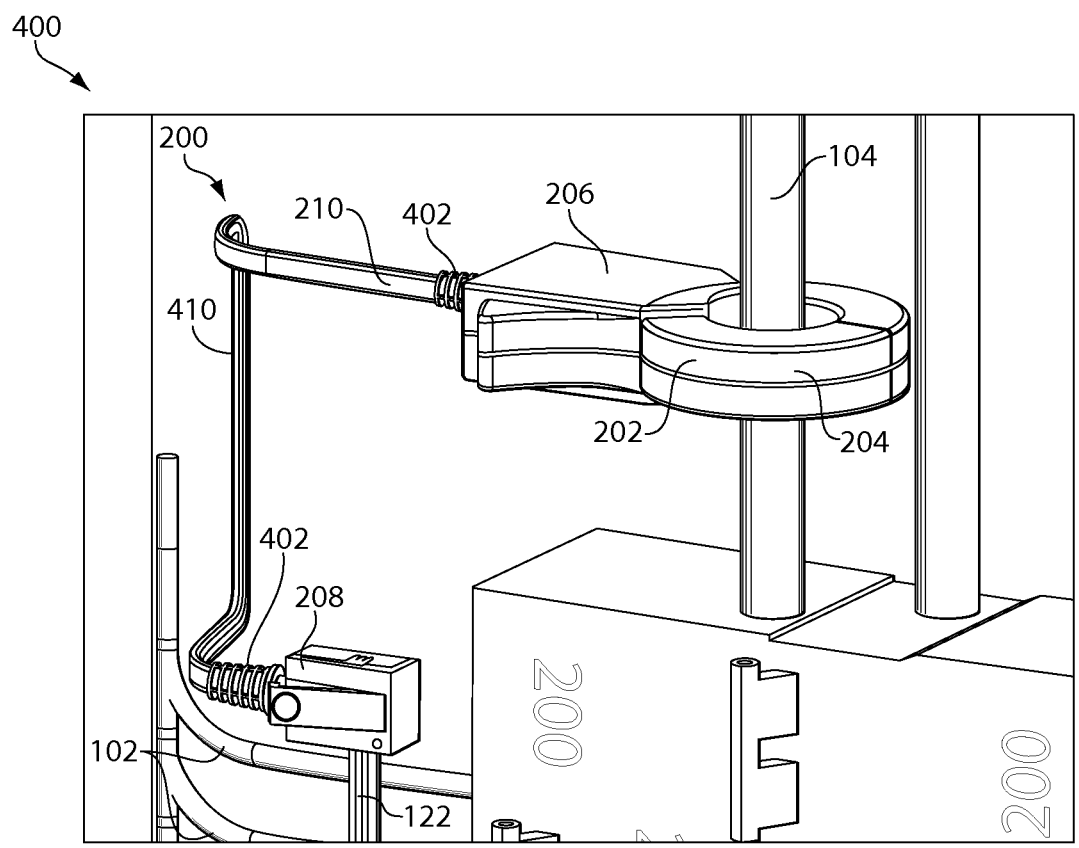
FIG. 5 is another schematic diagram of a CT circuit within a load center in accordance with aspects of the present invention.

For example, FIGS. 4-5 illustrate the CT circuit 200 within a load center 400 in accordance with aspects of the present invention. The load center 400 includes an enclosure 410. Within the enclosure 410, the load center 400 includes circuit branches 102, an input line 104, circuit breakers 113, 115, a CT circuit 200 and a communication bus 122, as discussed above. The circuit breakers 113, 115 are coupled to the circuit branches 102 and the input line 104 and are arranged in two columns. According to one embodiment, the load center 400 also includes a cover which separates the circuit breakers 113, 115 from the circuit branches 102, input line 104, CT circuit 200 and communication bus 122, thereby allowing a user to operate the circuit breakers 113, 114 without contacting live electrical parts within the load center 400. In one embodiment, the cover may be removed when an individual desires to access live components within the load center 400 (e.g. in order to couple a CT circuit 200 to the input line 104 and communication bus 122).

As described above, the CT circuit 200 includes a housing 202. The first portion 204 of the housing 202 is coupled around the input line 104 which provides mains power to the circuit branches 102 and the connection portion 208 is coupled to the communication bus 122. The second portion 206 of the housing 202 is coupled to the connection portion 208 via a flexible cable 210. The connection portion 208 and flexible cable 210 allow the CT circuit 200 to monitor the input line 104 while being coupled to the communications bus 122, even though the input line 104 is not located adjacent the communications bus 122 and the CT within the CT circuit 200 is likely too large (e.g. rated for 200 A to handle input mains power) to be located adjacent the communications bus 122.

According to one embodiment, the flexible cable 210 includes a strain relieving feature. For example, in one embodiment, the flexible cable 210 includes an over molded feature 402 located at the end of the cable 210 attached to the second portion 206 and/or the end of the cable 210 attached to the connection portion 208.

Even though examples in accordance with the present invention are described herein in reference to a load center, other examples may be utilized within any electrical system in which current, power and energy of a power line are desired to be monitored. It also is to be appreciated that examples in accordance with the present invention may be utilized to monitor any type (e.g., commercial or residential) or size system.

Even though examples in accordance with the present invention are described herein as utilizing a current transformer capable of being clamped onto a circuit branch or input line, other examples may utilize a different type of current sensor. For example, current sensors utilizing shunt resistance, hall-effect, and toroidal (solid core) current transformers may be used.

Even though examples in accordance with the present invention are described herein as utilizing a current sensor capable of monitoring a circuit branch, other examples may utilize any other types of sensor (e.g. temperature or humidity sensors) which is desired to be located at a different location than the communication bus within a load center.

By coupling a smart sensor circuit and CT to a communications bus via a connection portion, separate from the smart sensor circuit, and a flexible cable, the connection portion is able to be connected to the communication bus at a different location within a load center then where the CT is coupled to a circuit branch or input line, providing enhanced connection flexibility within the load center.

Having thus described several aspects of at least one embodiment of this invention, it is to be appreciated various alterations, modifications, and improvements will readily occur to those skilled in the art. Such alterations, modifications, and improvements are intended to be part of this disclosure, and are intended to be within the spirit and scope of the invention. Accordingly, the foregoing description and drawings are by way of example only.

What is claimed is:

1. A current monitoring device comprising:
   a current transformer configured to be removeably coupled to a power line within a load center and to generate a reference signal having a level related to a current level of the power line within the load center;
   a sensor circuit connected to the current transformer and configured to convert the reference signal to a measurement signal;
   a flexible cable having a first end and a second end, the first end coupled to the sensor circuit; and
   a connection portion coupled to the second end of the flexible cable and configured to be removeably coupled to a communications bus within the load center;
   wherein the sensor circuit is further configured to provide the measurement signal to the communication bus via the flexible cable and the connection portion, and
   wherein the connection portion includes a lid capable of being opened and closed and configured to clamp the communication bus in place within the connection portion when closed in a locked position.

2. The current monitoring device of claim 1, further comprising a first housing containing the sensor circuit and the current transformer, wherein the first housing includes a first portion containing the current transformer and a second portion containing the sensor circuit, and wherein the first portion is rotatably coupled to the second portion.

3. The current monitoring device of claim 2, wherein the first housing is configured to be rotated between a first position and a second position,
   wherein, in the first position, the first portion of the first housing is rotated about the second portion to allow external access to an interior chamber, and
   wherein, in the second position, the first portion of the first housing is rotated about the second portion so that the first portion encompasses the interior chamber.

4. The current monitoring device of claim 2, wherein the connection portion includes a second housing coupled to the second end of the flexible cable.

5. The current monitoring device of claim 4, wherein the second housing includes an insulation displacement connector configured to couple the connection portion to the communication bus.

6. The current monitoring device of claim 5, wherein the second housing further includes a comb configured to separate discrete conductors of the communication bus.

7. The current monitoring device of claim 1, wherein the measurement signal is a digital measurement signal.

8. The current monitoring device of claim 1, wherein the current transformer is a 200 A current transformer.

9. A method for monitoring a power line within a load center, the method comprising:
   providing a current transformer configured to be removeably coupled to the power line within the load center;
   providing a sensor circuit coupled to the current transformer;
   providing a connection portion configured to be removeably coupled to a communication bus within the load center;
   providing a flexible cable having a first end coupled to the sensor circuit and a second end coupled to the connection portion;
   coupling the current transformer to the power line within the load center;
   coupling the connection portion to the communication bus within the load center;
   generating, with the current transformer, a reference signal having a level related to a current level of the power line;
   converting, with the sensor circuit, the reference signal to a measurement signal; and
   providing, via the connection portion, the measurement signal to the communication bus.

10. The method of claim 9, wherein the current transformer is coupled to the power line at a first location within the load center and the connection portion is coupled to the communication bus at a second location within the load center.

11. The method of claim 9, wherein the measurement signal is a digital measurement signal.

12. The method of claim 9, wherein the act of coupling a current transformer to the power line includes encompassing the power line within the current transformer.

13. The method of claim 9, wherein the act of coupling the connection portion to the communication bus includes piercing an outer insulation layer of the communication bus with at least one contact of the connection portion and connecting the at least one contact to a conductor within the communication bus.

14. The method of claim 9, wherein the current transformer is a 200 A current transformer.

15. A device for monitoring current in a power line within a load center, the device comprising:
- a current transformer configured to be coupled to the power line at a first location within the load center and to generate a reference signal having a level related to a current level of the power line;
- a sensor circuit configured to convert the reference signal to a measurement signal and provide data related to the measurement signal to a communication bus;
- a flexible cable having a first end and a second end, the first end coupled to the sensor circuit;
- a connection portion coupled to the second end of the flexible cable and;
- means for coupling the sensor circuit to the communication bus and clamping the connection portion onto the communication bus to hold the communication bus in place within the connection portion at a second location within the load center.

16. The device of claim 15, wherein the measurement signal is a digital measurement signal.

17. The device of claim 16, wherein the housing is configured to be rotated between a first position and a second position,
- wherein, in the first position, the first portion of the housing is rotated about the second portion to allow external access to an interior chamber, and
- wherein, in the second position, the first portion of the housing is rotated about the second portion so that the first portion encompasses the interior chamber.

18. The device of claim 15, further comprising a housing containing the sensor circuit and the current transformer, wherein the housing includes a first portion containing the current transformer and a second portion containing the sensor circuit, and wherein the first portion is rotatably coupled to the second portion.

19. The device of claim 15, wherein the current transformer is a 200 A current transformer.

* * * * *